United States Patent
Bahout

(10) Patent No.: US 6,928,530 B2
(45) Date of Patent: Aug. 9, 2005

(54) METHOD AND DEVICE FOR SEQUENTIAL READOUT OF A MEMORY WITH ADDRESS JUMP

(75) Inventor: Yvon Bahout, Fuveau (FR)

(73) Assignee: STMicroelectronics SA, Montrouge (FR)

( * ) Notice: Subject to any disclaimer, the term of this patent is extended or adjusted under 35 U.S.C. 154(b) by 475 days.

(21) Appl. No.: 10/081,740

(22) Filed: Feb. 22, 2002

(65) Prior Publication Data
US 2002/0129219 A1 Sep. 12, 2002

(30) Foreign Application Priority Data
Feb. 23, 2001 (FR) .............................. 01 02501

(51) Int. Cl.[7] .............................................. G06F 9/42
(52) U.S. Cl. .................... 711/213; 712/208; 712/233
(58) Field of Search ......................... 711/213; 712/208, 712/233

(56) References Cited

U.S. PATENT DOCUMENTS 5,651,123 A   7/1997   Nakagawa et al.
5,831,997 A   11/1998  Kodashiro

OTHER PUBLICATIONS

Greenfield, Josheph D. and William C. Wary, "Using Microprocessors and Microcomputers: The 6800 Family"; John Wiley & Sons 1981; pp. 48–52, 115–116, 175–181, and 193–194.*

* cited by examiner

Primary Examiner—Reginald G. Bragdon
(74) Attorney, Agent, or Firm—Lisa K. Jorgenson; Allen, Dyer, Doppelt, Milbrath & Gilchrist, P.A.

(57) ABSTRACT

A memory implementing an incremental address counter is sequentially read. An address jump includes detecting an address jump signal, incrementing the incremental address counter, and reading the content of the memory at the incremented address. The content read at the incremented address is transferred into the incremental address counter, and the content of the memory is read at the address contained in the incremental address counter.

23 Claims, 2 Drawing Sheets

METHOD AND DEVICE FOR SEQUENTIAL READOUT OF A MEMORY WITH ADDRESS JUMP

FIELD OF THE INVENTION

The present invention relates to serial access and sequential readout type memories, and more particularly, to a method and device for performing an address jump with such memories.

BACKGROUND OF THE INVENTION

A prior art device for sequential readout of a memory will now be described with reference to the block diagram of FIG. 1. A memory 10 comprising memory cells and address circuits for these cells is read sequentially from one address to the next using a counter 12 whose value, which corresponds to the address of the cell being read, is incremented by one unit each time an INC signal occurs.

The start of the count address is given by a shift register 14 which contains, in addition to the start address in portion 16, the code of the instruction in portion 18. The shift register 14 is loaded by a microcontroller 20, external to the memory, at the rate of the clock pulses CK which are applied to the shift register 14 and to an AND logic gate 22.

An overflow detector 24 for the shift register 14 supplies a signal for opening the AND logic gate 22 as soon as successive shifts lead to a start of the emptying of the register contents. Further to this opening, the clock pulses CK are applied to a divide-by-N divider circuit 26, where N is the number of bits of a word contained in a memory address, e.g., N=8 or 16 or 24.

The contents of counter 12 are thus incremented by one unit each time the divider has counted N pulses of the clock, and thus selects the next address. The binary digits of a word at the address selected by the counter 12 are read in succession and are stored in an output shift register 28 at the rate of the clock pulses CK. The binary digits are then sent to the microcontroller 20.

The above description shows that the memory 10 is read sequentially line by line with the counter 12 being incremented by the INC signal appearing at every N pulses of the clock. Each clock pulse corresponds to the readout of a digit forming the binary word contained at the address Ad given by the counter 12.

When the readout is to be carried out with a jump to a new address, the microcontroller must send a new message that contains a jump instruction and a new address. It is thus necessary for the microcontroller 20 to send a complete message, which takes time and reduces the average speed of the operations in a program. This problem is enhanced as the program contains many address jumps.

SUMMARY OF THE INVENTION

In view of the foregoing background, an object of the present invention is to provide for the sequential readout of a memory in which address jumps are very fast.

This and other objects, advantages and features according to the present invention are provided by sending to the memory not a complete message but rather a command signal, i.e., without an address, so that the command signal is interpreted by the memory as indicating that the new address is to use the value of the word contained at the following address.

One aspect of the invention is a method of reading sequentially from a memory implementing an incremental address counter, characterized in that an address jump comprises the following steps:

(a) detecting an address jump signal;
(b) incrementing the incremental address counter;
(c) reading the content of the memory at the incremented address;
(d) transferring the content read at the incremented address into the incremental address counter; and
(e) reading the content of the memory at the address contained in the incremental address counter.

Operation (a) can comprise decoding a jump instruction code. The incrementation of the address counter can be by one unit or more.

Another aspect of the invention is a device for reading sequentially from a memory comprising an input register containing an instruction code and a memory address code, an incremental address counter of the memory which receives the address code from the input register, and an output register of the memory which records signals read at the address indicated by the incremental address counter.

The memory further comprises a detection circuit for detecting an address jump instruction and supplying an incrementation signal for incrementing the incremental address counter, and means for transferring the content read at the incremented address into the incremental address counter.

BRIEF DESCRIPTION OF THE DRAWINGS

Other characteristics and advantages of the present invention will become more apparent from reading the following description of a specific embodiment, the description being given in conjunction with the appended drawings, in which.

DETAILED DESCRIPTION OF THE PREFERRED EMBODIMENTS

Figure 1:
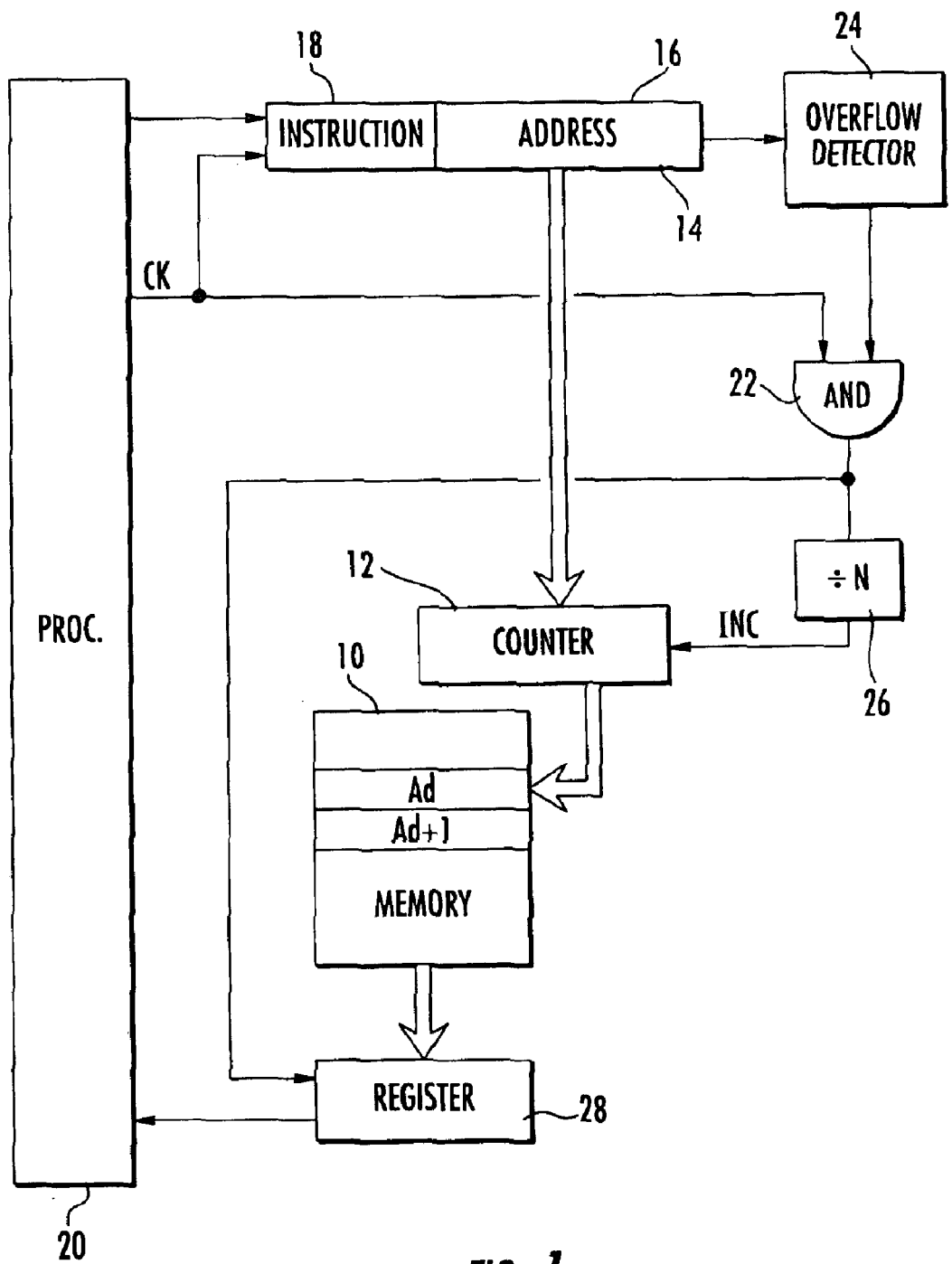
FIG. 1 is a simplified block diagram of a device for the sequential readout of a memory according to the prior art.
Figure 2:
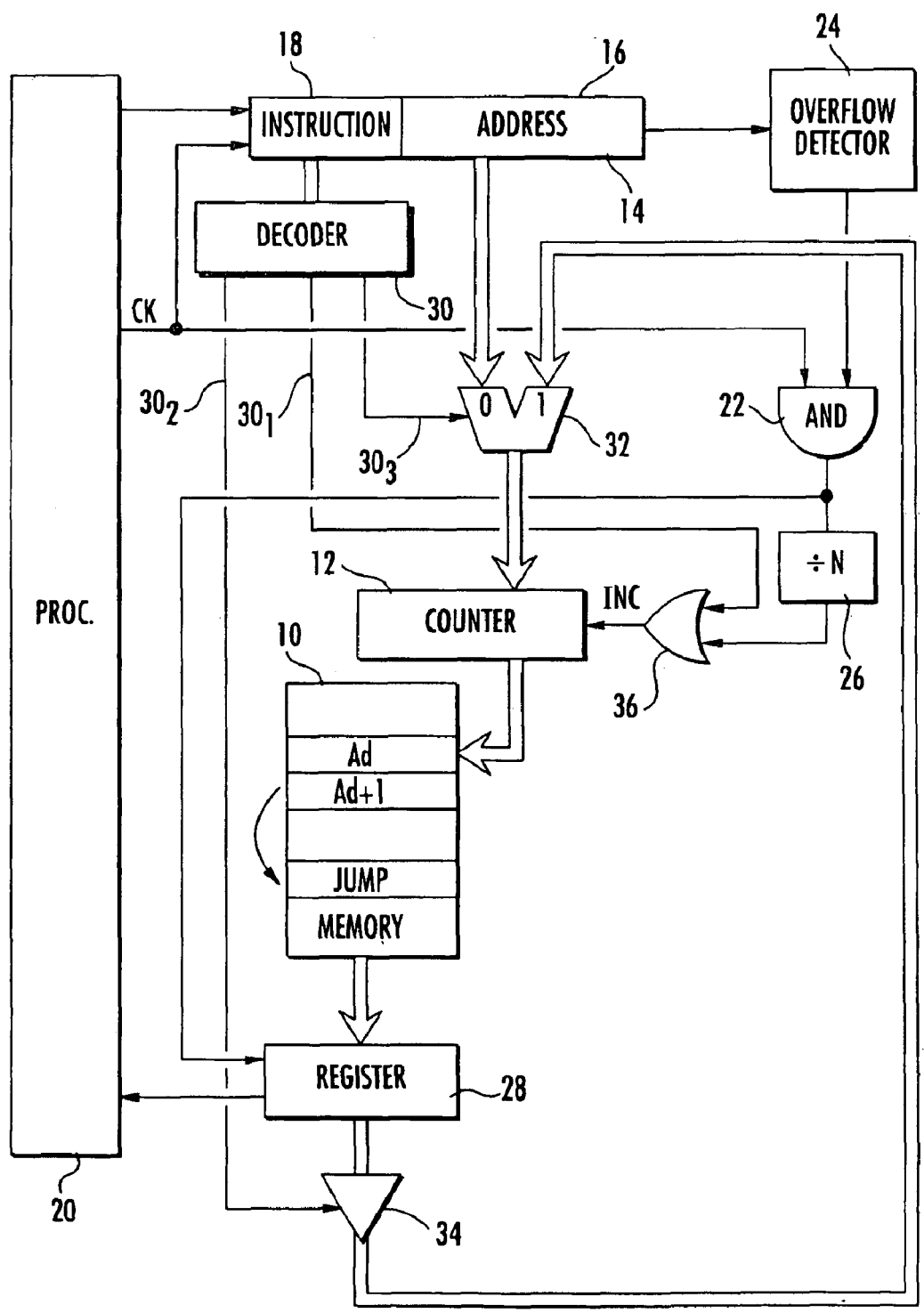
FIG. 2 is a simplified block diagram of a device for the sequential readout of a memory according to the present invention.

The diagram of FIG. 1 corresponds to a prior art device which has been described above. The diagram of FIG. 2 uses the elements of the diagram of FIG. 1 bearing the same references as well as other elements so as to form the device in accordance with the invention. Those elements which are common to both sequential readout devices will not be described again.

The elements that have been added are as follows. A jump instruction decoder circuit 30 whose input terminals are connected to the output terminals of the shift register 14 correspond to the instruction code. The jump instruction decoder circuit 30 supplies on its three output terminals $30_1$, $30_2$ and $30_3$ three time shifted signals corresponding to the decoding of an address jump.

A first signal, referred to as an address increment signal, on terminal $30_1$ is applied to one of the two input terminals of an OR logic gate 36 of which the other input terminal is connected to the output terminal of the divider circuit 26. A second signal, referred to as a transfer signal, on terminal $30_2$ is applied to an input terminal of an electronic gate 34 whose other input terminals are connected to the parallel output terminals of the output shift register 28. A third signal, referred to as a multiplexing signal, on terminal $30_3$ is applied to a control input terminal of an address multiplexer circuit 32.

The address multiplexer circuit 32 has a control input terminal connected to the output terminal $30_3$ of the decoder circuit 30. The address multiplexer circuit 32 directs to the address counter 12 either the address contained in the shift register 14 or an address read in the memory.

The operation of the device according to the invention is as follows. In a sequential readout, the operation is that of the prior art device. In the case of an address jump, the added elements lead to the following operation. The decoding of the instruction by the decoder circuit 30 produces a first increment signal on output terminal $30_1$ which, via the logic gate 36, increments the counter 12 by one unit such that the following address (Ad+1) of the memory is selected.

When the word at the following address is stored in the output shift register, it is transferred to the multiplexer 32 via the electronic gate 34 which is opened by the transfer signal on output terminal $30_2$ of the decoder circuit 30. This transferred word, which corresponds to the following address of the program, is recorded in the counter 12 via the multiplexer circuit 32 controlled by a multiplexing signal supplied on the output terminal $30_3$ of the decoder circuit 30.

The sequential readout can then start from that new address or there can be another address jump initiated by the decoding of a new address jump instruction. Instead of using an address jump instruction which is decoded as indicated above, which takes up at least the time to transfer digits of the instruction code, the invention can also be implemented by a specific signal supplied by the microcontroller 20. This signal is applied directly to circuits 32, 34 and 36 with the appropriate delays.

That which is claimed is:

1. A method of reading sequentially from a memory having an incremental address counter associated therewith, the method comprising:
   detecting an address jump signal without detecting a memory address code;
   incrementing the incremental address counter based upon the detected address jump signal;
   reading a content of the memory at the incremented address;
   transferring the content read at the incremented address to the incremental address counter; and
   reading the content of the memory at the address contained in the incremental address counter.

2. A method according to claim 1, wherein detecting an address jump signal comprises decoding an instruction code.

3. A method according to claim 1, wherein the incremental address counter is incremented by at least one unit.

4. A method according to claim 1, wherein transferring the content read comprises transferring a memory address code corresponding to a following address.

5. A method for reading sequentially from a memory, the method comprising:
   providing an instruction code and a memory address code to an input register;
   providing the memory address code and not the instruction code to an incremental address counter having an input connected to the input register and an output connected to the memory;
   reading the memory at the memory address code indicated by the incremental address counter;
   recording contents read from the memory in an output register;
   detecting an address jump instruction code using an address jump detection circuit having an input connected to the input register, and an output connected to the incremental address counter;
   providing an increment signal from the address jump detection circuit output connected to the incremental address counter based upon the detected address jump instruction code; and
   transferring the recorded contents read at the incremented address to the incremental address counter.

6. A method according to claim 5, wherein the recorded contents comprise a memory address code corresponding to a following address.

7. A method according to claim 5, wherein the incremental address counter is incremented by at least one unit.

8. A method according to claim 5, wherein the address jump detection circuit comprises a decoder circuit.

9. A method according to claim 5, wherein the transferring is performed using a transfer circuit connected to the incremental address counter and to the output register.

10. A method according to claim 9, wherein the transfer circuit comprises:
    a logic gate having an input connected to the output register for transferring in parallel the contents therefrom corresponding to the recorded contents at the incremented address; and
    a multiplexer circuit having an input connected to an output of the logic gate, and an output connected to the incremental address counter for directing thereto either the recorded contents in the input register or the memory address code at the incremented address.

11. A device for reading sequentially from a memory, the device comprising:
    an input register containing an instruction code and a memory address code;
    an incremental address counter having an input connected to said input register for receiving the memory address code therefrom and not the instruction code, and an output connected to the memory;
    an output register having an input connected to the memory for recording contents read at the memory address code indicated by said incremental address counter;
    an address jump detection circuit having an input connected to said input register for detecting an address jump instruction code, and an output for supplying an increment signal for incrementing said incremental address counter; and
    a transfer circuit connected to said incremental address counter and to said output register for transferring the recorded contents read at the incremented address to said incremental address counter.

12. A device according to claim 11, wherein the recorded contents comprise a memory address code corresponding to a following address.

13. A device according to claim 11, wherein said address jump detection circuit comprises a decoder circuit.

14. A device according to claim 11, wherein said transfer circuit comprises:
    a logic gate having an input connected to said output register for transferring in parallel the contents therefrom corresponding to the recorded contents at the incremented address; and
    a multiplexer circuit having an input connected to an output of said logic gate, and an output connected to said incremental address counter for directing thereto either the memory address code in said input register or the recorded contents at the incremented address.

15. A device for reading sequentially from a memory, the device comprising:

an input register containing an instruction code and a memory address code;

an incremental address counter having an input connected to said input register for receiving the memory address code therefrom and not the instruction code, and an output connected to the memory;

an output register having an input connected to the memory for recording contents read at the memory address code indicated by said incremental address counter;

an address jump detection circuit having an input connected to said input register for detecting an address jump instruction code, and an output for supplying an increment signal for incrementing said incremental address counter;

a logic gate having an input connected to said output register for transferring the contents therefrom corresponding to the recorded contents at the incremented address; and a multiplexer circuit having an input connected to an output of said logic gate, and an output connected to said incremental address counter for directing thereto either the memory address code in said input register or the recorded contents at the incremented address.

16. A device according to claim 15, wherein the recorded contents comprise a memory address code corresponding to a following address.

17. A device according to claim 15, wherein said address jump detection circuit comprises a decoder circuit.

18. A device according to claim 15, wherein said logic gate transfers the contents from the memory to said multiplexer circuit in parallel.

19. A device comprising:

a microprocessor;

an input register connected to said microprocessor for receiving an instruction code and a memory address code therefrom;

an incremental address counter having an input connected to said input register for receiving the memory address code therefrom and not the instruction code;

a memory having an input connected to an output of said incremental address counter;

an output register having an input connected to said memory for recording contents read at the memory address code indicated by said incremental address counter;

an address jump detection circuit having an input connected to said input register for detecting an address jump instruction code, and an output for supplying an increment signal for incrementing said incremental address counter; and a transfer circuit connected to said incremental address counter and to said output register for transferring the recorded contents read at the incremented address to said incremental address counter.

20. A device according to claim 19, wherein the recorded contents read at the memory address code indicated by said incremental address counter are read sequentially from said memory.

21. A device according to claim 19, wherein the recorded contents comprise a memory address code corresponding to a following address.

22. A device according to claim 19, wherein said address jump detection circuit comprises a decoder circuit.

23. A device according to claim 19, wherein said transfer circuit comprises:

a logic gate having an input connected to said output register for transferring in parallel the contents therefrom corresponding to the recorded contents at the incremented address; and a multiplexer circuit having an input connected to an output of said logic gate, and an output connected to said incremental address counter for directing thereto either the memory address code in said input register or the recorded contents at the incremented address.

* * * * *